United States Patent [19]

Ono et al.

[11] Patent Number: 5,559,735
[45] Date of Patent: Sep. 24, 1996

[54] FLASH MEMORY HAVING SELECT TRANSISTORS

[75] Inventors: Takashi Ono; Masami Ikegami, both of Tokyo, Japan

[73] Assignee: Oki Electric Industry Co., Ltd., Tokyo, Japan

[21] Appl. No.: 412,276

[22] Filed: Mar. 28, 1995

[51] Int. Cl.$^6$ .................................................. G11C 11/34
[52] U.S. Cl. .............................. 365/185.17; 365/185.33; 257/315
[58] Field of Search .................................... 365/185, 900, 365/218, 185.17, 185.33; 257/314, 315

[56] References Cited

PUBLICATIONS

Itoh et al., "A New Nand Cell for Ultra High Density 5V—only EEPROMS", May 10, 1988.
Johnson et al., "A 16 kb Electrically Erasable Nonvolatile Memory", IEEE ISSCC Dig. Tech. Pap., pp. 152–153, 271, 1980.

*Primary Examiner*—David C. Nelms
*Assistant Examiner*—Huan Hoang

[57] ABSTRACT

A plurality of stack type transistors each formed by successively stacking a tunnel oxide, a floating gate, an ONO stacked insulating film and a control gate on one another are provided on a silicon semiconductor substrate. A select transistor is provided adjacent to each of the stack type transistors. A flash memory cell is made up of two transistors: the stack type transistor and the select transistor. Owing to the present construction, a flash memory cell can be achieved which is operable at a low voltage, excellent in rewrite endurance, rewritable on a one-pulse basis and free from verification and overerasing cares. Accordingly, a high-reliable flash memory can be realized.

3 Claims, 6 Drawing Sheets

FIG. 3 PRIOR ART
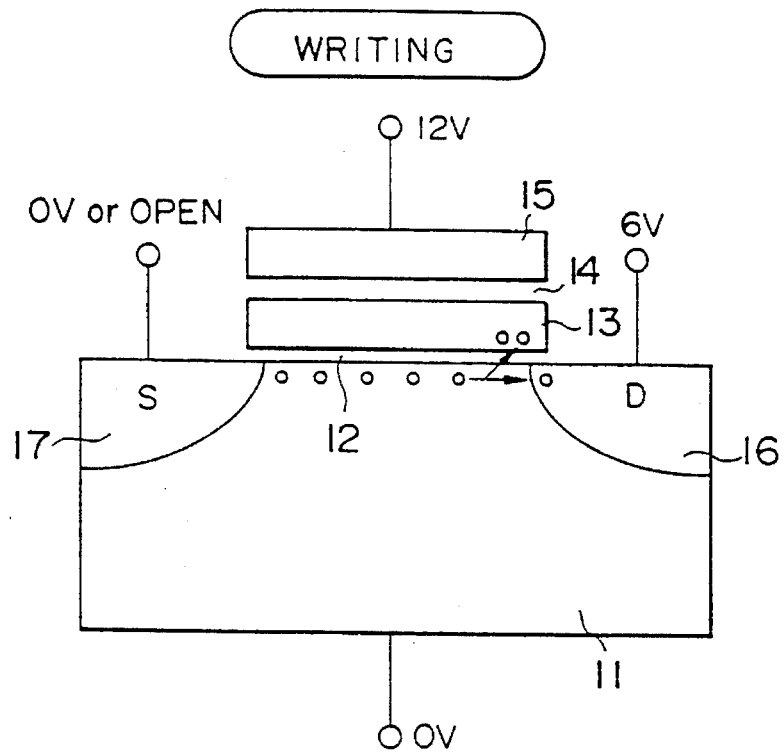
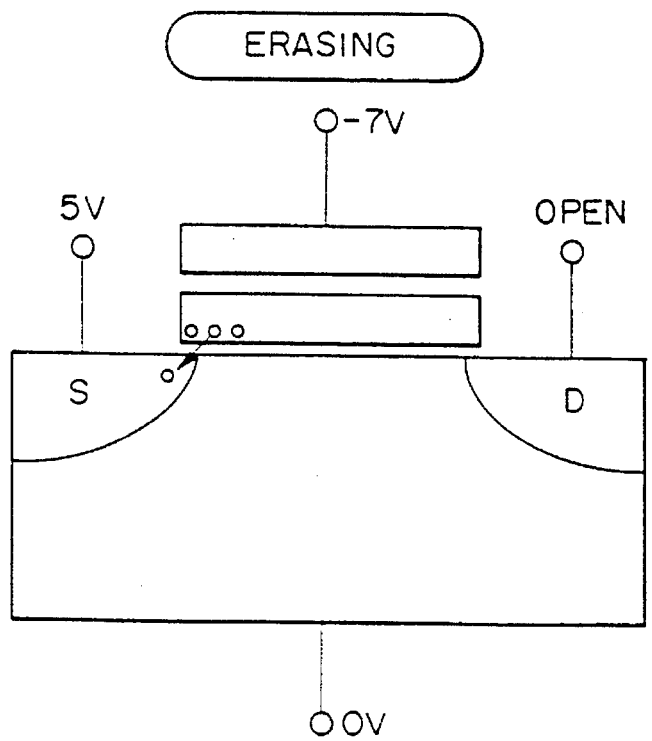

FIG. 6
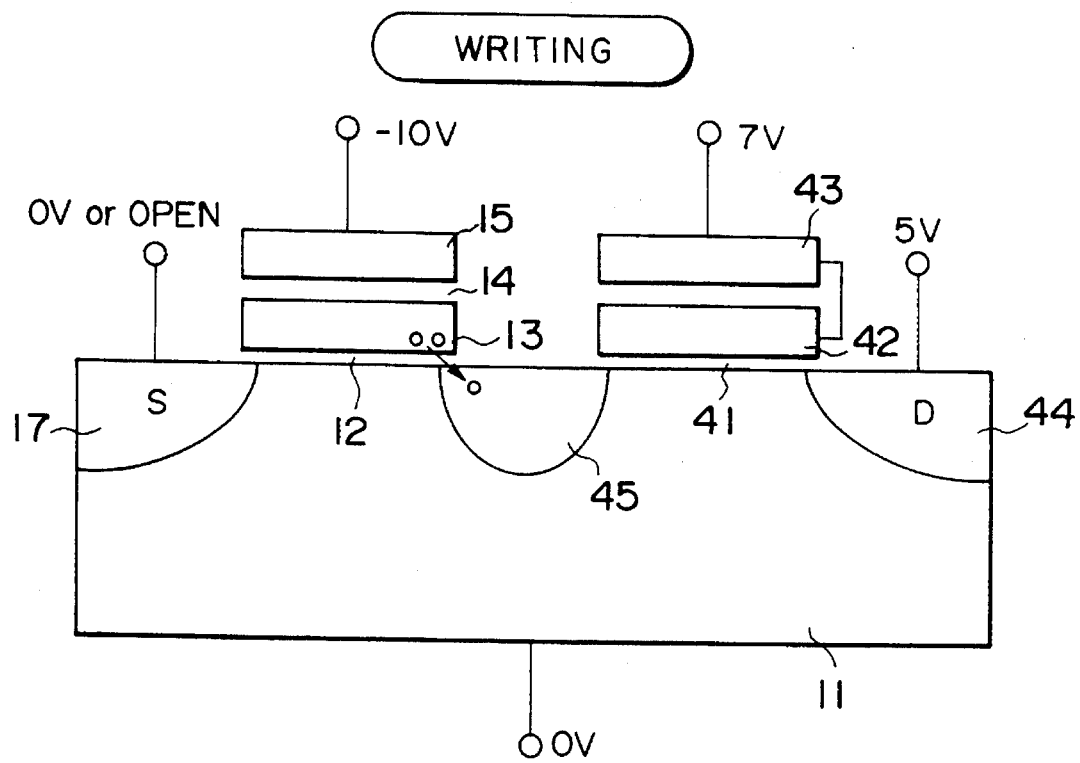
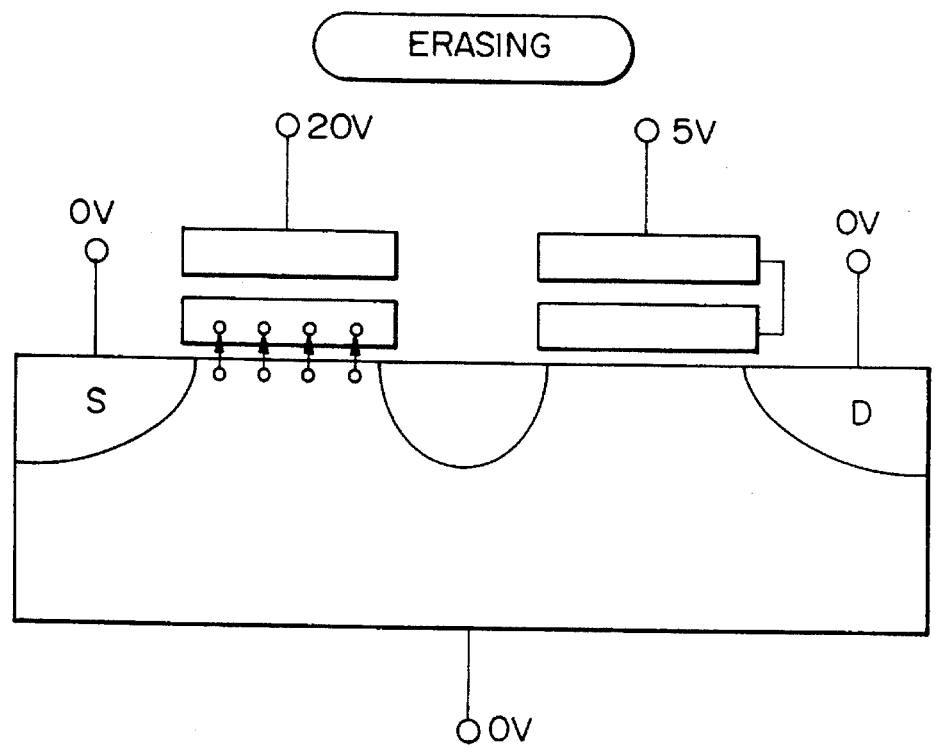

FIG. 6
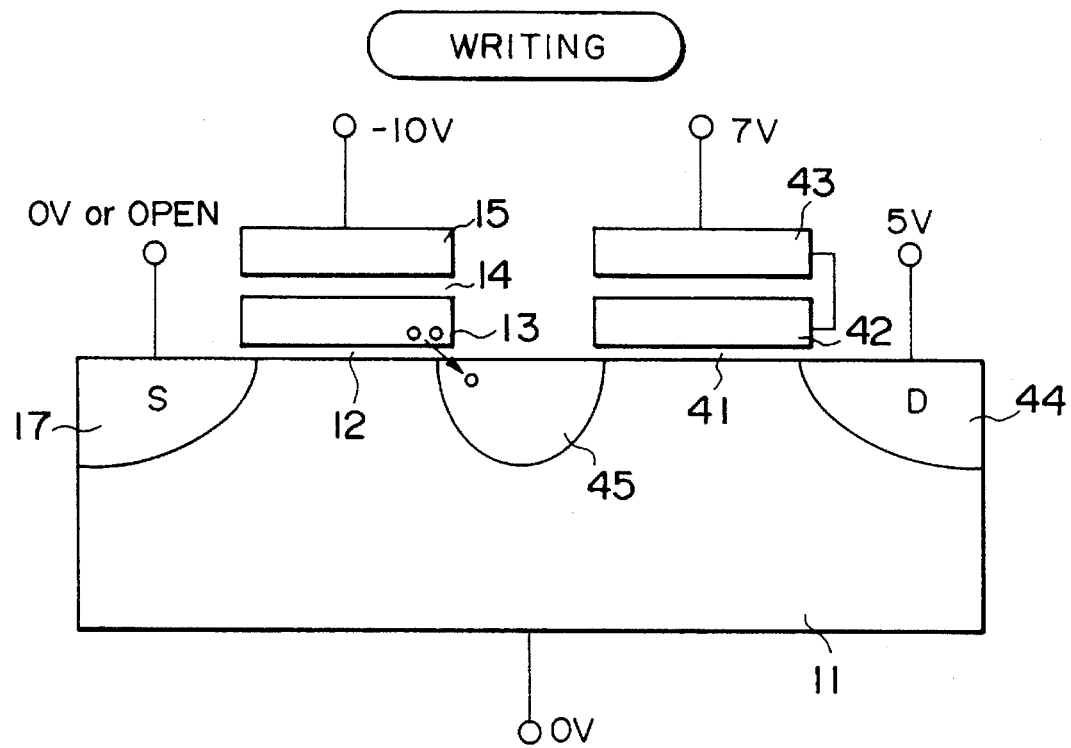
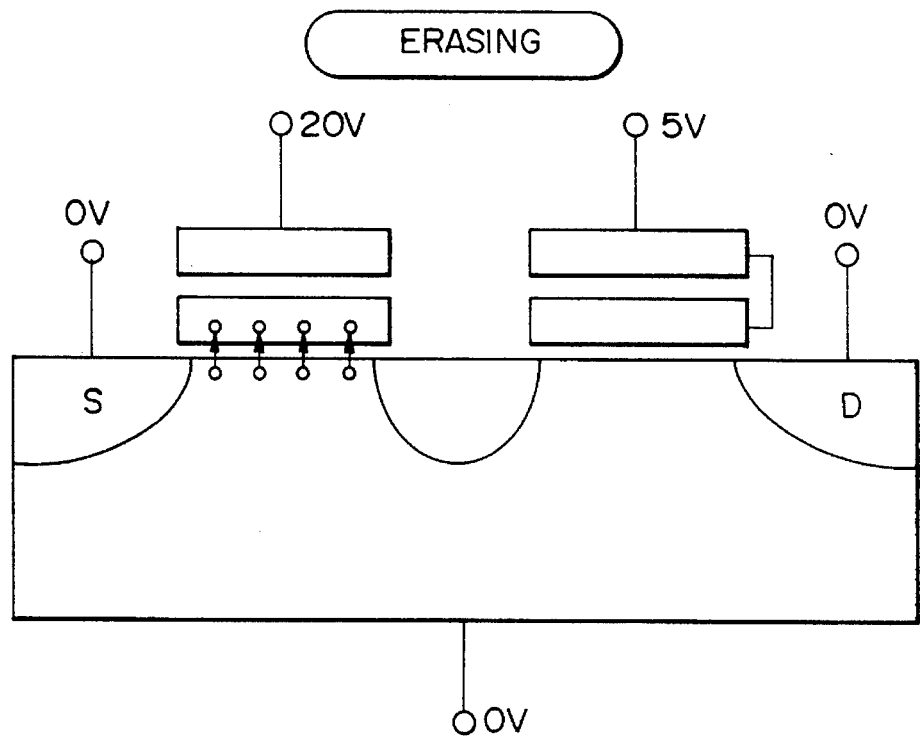

FLASH MEMORY HAVING SELECT TRANSISTORS

BACKGROUND OF THE INVENTION

1. Field of the Invention

This invention relates to a flash memory, and particularly to a cell structure of a type wherein one of cells employed in a flash memory and each having a select transistor is composed of two transistors.

2. Description of the Related Art

Each of stack type memory cells employed in a flash memory has a merit that the number of transistors may be one per cell. Since a technique that is a direct extension of an ultraviolet erase type EPROM (Erasable Programmable Read Only Memory), is used, the stack type memory cells are able to become the mainstream of the present flash memory. A cross-sectional view of stack type memory cells will first be shown in FIG. 1. In FIG. 1, stack type transistors each formed by successively stacking a tunnel oxide 12, a floating gate 13, an ONO (Oxide-Nitride-Oxide) stacked insulating film 14 and a control gate 15 on one another are provided on a silicon semiconductor substrate 11. A drain diffusion layer 16 and a source diffusion layer 17 are formed in the surface of the silicon semiconductor substrate 11, which is provided in the vicinity of each stack type transistor. An interlevel insulating film 18 and a contact hole 19 defined in the interlevel insulating film 18 are provided on each stack type transistor and are connectable to the drain diffusion layer 16, for example, through a metal conductor or interconnect 20. A surface protection film 21 is formed on the metal interconnect 20.

FIG. 2 is a plan view showing the manner in which the stack type memory cell transistors are disposed in array form. A region surrounded by the dotted line corresponds to one memory cell. The same regions as those shown in FIG. 1 are identified by like reference numerals. A plurality of the control gates 15 are electrically connected to one another to form each of control lines 30. A plurality of the metal interconnects 20 on the drain diffusion layers 16 are electrically connected to one another so as to run perpendicular to the word lines 30 to form each of bit lines 31. Further, a plurality of the source diffusion layers 17 are electrically connected to one another so as to run parallel to the word lines 30 to form a common source diffusion-layer conductor or interconnect 32. FIG. 1 corresponds to a sectional view taken along line A–A' in FIG. 2. A method of writing data into each stack type memory cell and erasing it therefrom will now be described with reference to FIG. 3. When it is desired to write the data into the memory cell, 12 V, 6 V and 0 V are respectively applied to the control gate 15, the drain diffusion layer 16, and the source diffusion layer 17 and the silicon semiconductor substrate 11. Under such a bias condition, a channel current flows between the source and drain of each memory cell transistor and hot electrons generated in the neighborhood of the drain thereof are injected and stored in the floating gate 13. The writing of the data into the stack type memory cell is completed in this way. Such writing is called "channel hot electron writing, which is abbreviated as CHE writing". When it is desired to erase the data from the memory cell, −7 V, 5 V and 0 V are respectively applied to the control gate 15, the source diffusion layer 17 and the silicon semiconductor substrate 11 and the drain diffusion layer 16 is brought into a floating state. Thus, the data erasing is performed by drawing the electrons from the floating gate 13 to the source diffusion layer 17. Since the data erasing is performed using a Fowler-Nordheim tunneling current that flows through the tunnel oxide 12, such erasing is called "FN erasing" for short. Since the CHE writing needs a large current whereas the FN erasing needs a reduced amount of current, a required voltage can be generated from an on-chip internal boosting circuit.

A NAND type memory cell will now be described. The NAND type memory cell has an advantage that since each contact hole 19 is unnecessary although one cell is made up of one transistor as in the case of the stack type memory cell, each NAND type memory cell can be made smaller and increased in capacity. Both of NAND type writing and erasing are performed using the Fowler-Nordheim tunneling current (FN writing and erasing) and hence a required write and erase voltage can be generated from an internal boosting circuit.

A FLOTOX (Floating gate Tunnel Oxide) type memory cell disclosed in a technical literature (IEEE International Solid State Circuit Conference Dig. Tech. 1980, pp 152–153, 271) is of a type wherein a tunnel oxide region is formed only in a portion of a lower part of a floating gate. The tunnel oxide region is formed on a drain diffusion layer. Since both writing and erasing are of the FN writing and erasing, a required write and erase voltage can be produced by an internal boosting circuit. Further, since the FLOTOX type memory cell has select transistors, a range for controlling a threshold value of each memory cell is wider than that of each of the stack type and NAND type memory cells as will be described later.

SUMMARY OF THE INVENTION

With the forgoing in view, it is therefore an object of the present invention to provide a flash memory which enables a low voltage operation and is excellent in rewrite endurance.

It is another object of the present invention to provide a flash memory which is rewritable on a one-pulse basis and is free from verification and overerasing cares.

According to one aspect of the present invention, for achieving the above objects, there is provided a flash memory comprising select transistors and stack type transistors.

Owing to the above construction, a high-reliable flash memory can be achieved.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 3 is a typical view for describing a method of writing data into the stack type cell employed in the conventional flash memory and reading it therefrom;

FIG. 5 is a plan view illustrating the flash memory cells shown in FIG. 4, which are disposed in array form; and FIG. 6 is a typical view for describing a method of writing data into the flash memory cells shown in FIG. 4 and erasing it therefrom.

DETAILED DESCRIPTION OF THE PREFERRED EMBODIMENTS

When a normal stack type memory cell is used, it is necessary for the normal memory cell to control a threshold value of the erased memory cell between 0.5 V to 3.5 V or so in such a manner that data is prevented from being overerased from the stack type memory cell. When the data is overerased from the memory cell, i.e., the threshold value is made negative, the memory cell is not turned OFF (i.e., it is brought into a state in which a current does not flow). Therefore, a read failure occurs when other cells electrically connected to the bit line 31 are read. It is thus necessary to repeatedly erase data while confirming the threshold value, i.e., repeat erase and read cycles.

Such an operation will be called "verify operation". A problem arose that an erasing time of a stack type memory cell takes a long time ranging from 0.5 sec to 1.0 sec. due to this verify operation.

It is necessary for a NAND type memory cell to control a threshold value of a normally-written memory cell between 0.5 V and 3.5 V or so. Namely, it is necessary to control the threshold value in such a manner as to avoid an excessive rise in the threshold value due to overwriting. Although the NAND type memory cell has a difference between writing and erasing, a problem arises that the verify operation is basically required in a manner similar to the stack type memory cell and a write speed becomes slow.

When it is desired to activate the stack type and NAND type memory cells at a low source voltage, e.g., 3 V, it is necessary to further narrow a threshold-value control range due to the verify operation. Further, a problem arises that an erase or write time is made longer and the stack type and NAND type memory cells are not suitable for a low source voltage operation.

In the case of a FLOTOX type memory cell, the tunnel oxide region must be formed only in a portion of a memory cell transistor. Therefore, a problem arises that a very large cell size which is nearly four times the size of each stack type memory cell, is required in consideration of a mask alignment allowance. Further, another problem arises that since the tunnel oxide is formed on the drain diffusion layer, the tunnel oxide is inferior in quality to a tunnel oxide formed on the silicon semiconductor substrate for the stack type and NAND type memory cell due to the influence of high-density impurities in the drain diffusion layer and hence it is difficult to improve rewrite endurance.

Figure 1:
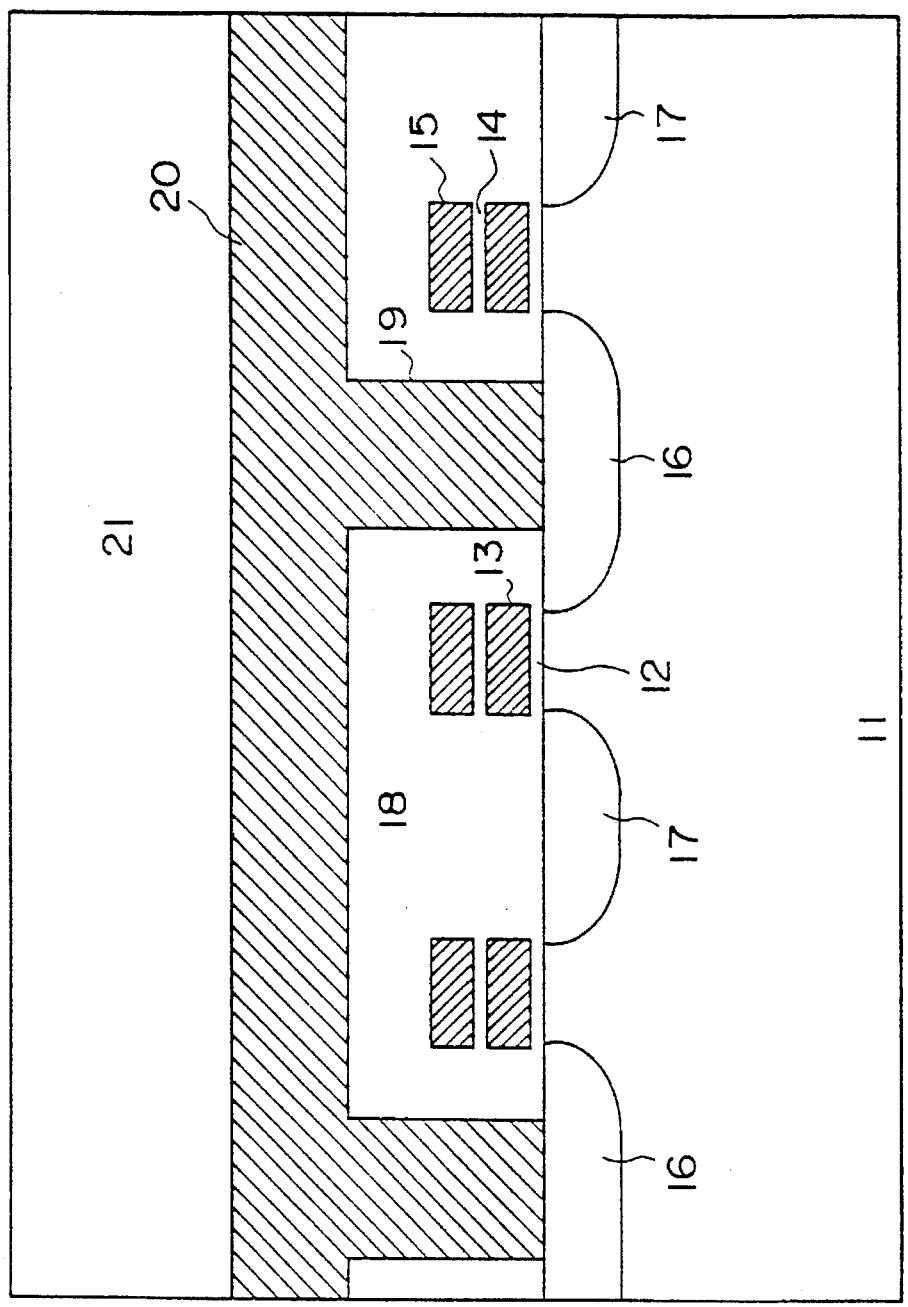
FIG. 1 is a cross-sectional view (corresponding to a cross-sectional view taken along line A–A' in FIG. 2) showing stack type cells employed in a conventional flash memory.
Figure 2:
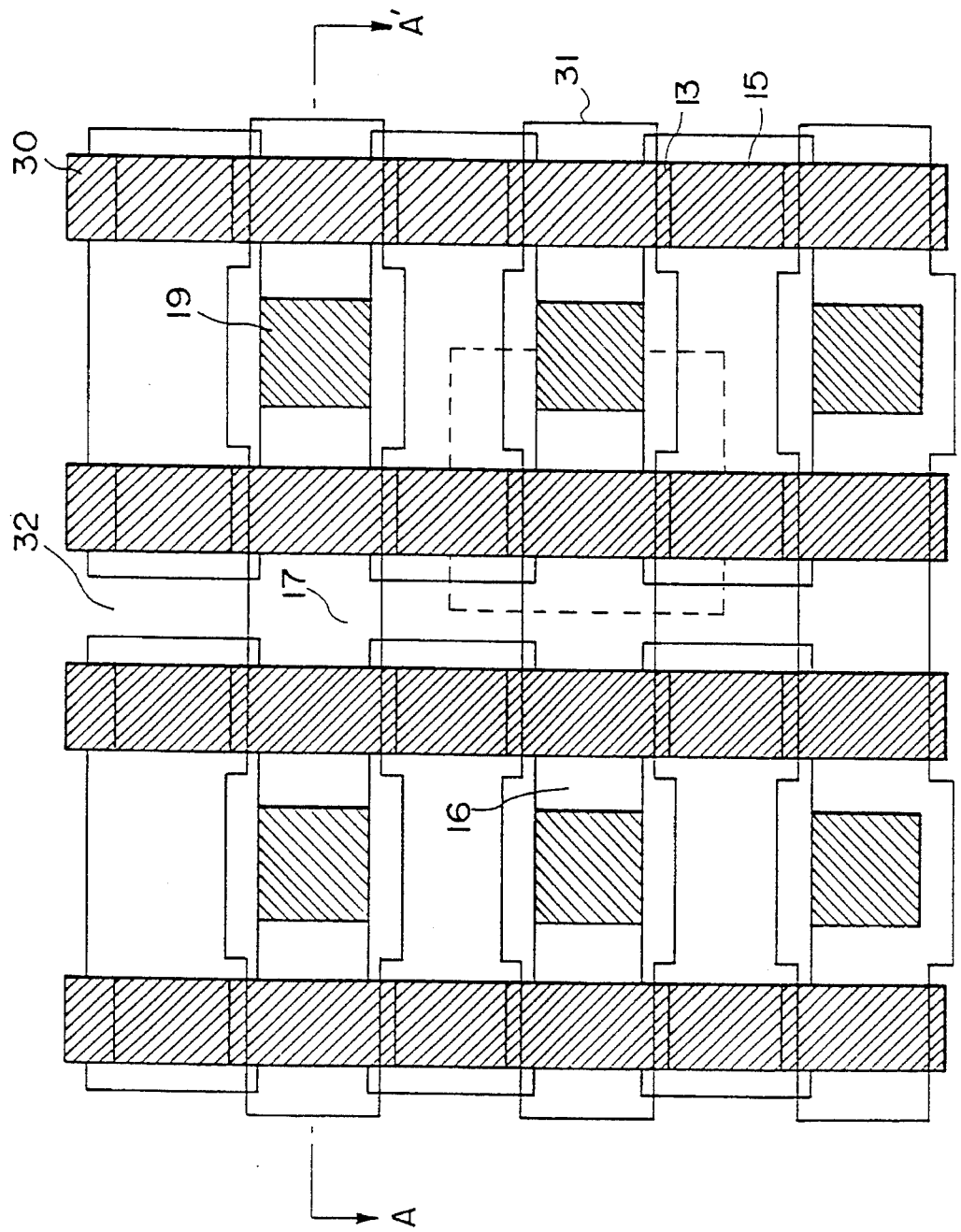
FIG. 2 is a plan view illustrating the stack type cells shown in FIG. 1, which are disposed in array form.
Figure 4:
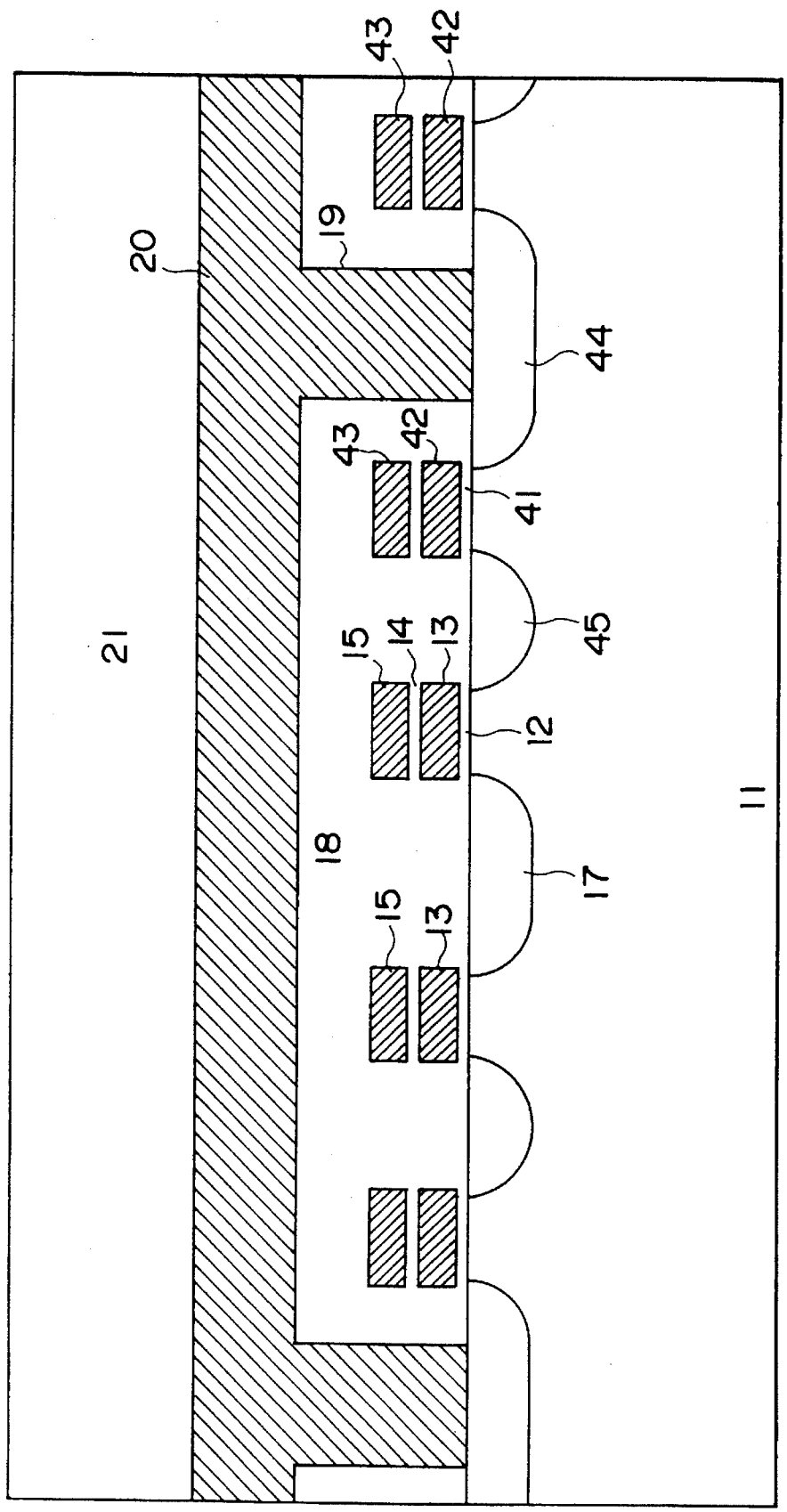
FIG. 4 is a cross-sectional view (corresponding to a cross-sectional view taken along line B–B' in FIG. 5) showing flash memory cells employed in one embodiment of the present invention.

FIG. 4 is a cross-sectional view showing a first embodiment of the present invention. Each stack type transistor formed by successively stacking a tunnel oxide 12, a floating gate 13, an ONO stacked insulating film 14 and a control gate 15 on one another in a manner similar to the conventional example, is disposed on the silicon semiconductor substrate 11 as a data storage area. The present invention is characterized in that each of select transistors is disposed adjacent to the stack type transistor. Each select transistor is composed of a gate oxide film 41 and select gates 42 and 43. One, i.e., a lower electrode of the select gates 42 and 43 is made of the same material as that of the floating gate 13 and the other, i.e., an upper electrode thereof is made of the same material as that of the control gate 15. The lower electrode and the upper electrode are electrically connected to one another at an unillustrated point. A source diffusion layer 17 and an intermediate diffusion layer 45 are provided on the surface of the silicon semiconductor substrate 11, which is located near the stack type transistor. Further, a drain diffusion layer 44 and the intermediate diffusion layer 45 are disposed on the surface of the silicon semiconductor substrate 11, which is close to the select transistor. The intermediate diffusion layer 45 is shared between the stack type transistor and the select transistor. Interlevel insulating films 18 and contact holes 19 defined in the interlevel insulating films 18 are disposed on their corresponding stack type and select transistors. The interlevel insulating film 18 and the contact hole 19 can be connected to the drain diffusion layer 44, for example, by a metal conductor or interconnect 20. The source diffusion layer 17 is electrically connected to another metal interconnect 20 at an unillustrated point. The intermediate diffusion layer 45 is not electrically connected to the metal interconnect 20 but is supplied with a potential from the select transistor. A surface protection film 21 is formed on the metal interconnect 20. A plan view in which memory cell transistors each composed of the two transistors, i.e., the stack type transistor and the select transistor are disposed in array form, will now be shown in FIG. 5. A region surrounded by the dotted line corresponds to one memory cell. The same regions as those shown in FIG. 4 are identified by like reference numerals. A plurality of the control gates 15 referred to above are electrically connected to one another to form each of control lines 52. A plurality of the select gates 43 referred to above are electrically connected to one another to form each of select word lines 51. The control line 52 is provided in parallel with the select word line 51. A plurality of the metal interconnects 20 referred to above are electrically connected to one another so as to run perpendicular to the control lines 52 and the select word lines 51 to form each of bit lines 31. Further, a plurality of the source diffusion layers 17 referred to above are electrically connected to one another so as to run parallel to the control lines 52 and the select word lines 51 to form a common source diffusion-layer conductor or interconnect 32. FIG. 4 corresponds to a sectional view taken along line B–B' in FIG. 5.

A method of writing data into the two-transistor type memory cell and erasing it therefrom will now be described with reference to FIG. 6. When it is desired to write the data into the memory cell, –10 V, 7 V and 5 V are respectively applied to the control gate 15, the select gates 42 and 43 and the drain diffusion layer 44. At this time, the silicon semiconductor substrate 11 and the source diffusion layer 17 do not necessarily require 0 V although being supplied with 0 V in the drawing. The silicon semiconductor substrate 11 and the source diffusion layer 17 may be placed in a floating state. Since the potential applied to the intermediate diffusion layer 45 becomes 5 V identical to that applied to the drain diffusion layer 44 under such a bias condition, the Fowler-Nordheim tunneling current (FN current) flows into the tunnel oxide 12 so that electrons are drawn or attracted from the floating gate 13 to the intermediate diffusion layer 45. Since the drawing of electrons from a memory cell that is undesired to draw them, can be prohibited by setting a bias potential applied to the drain diffusion layer 44 to 0 V so that the potential of the intermediate diffusion layer 45 is lowered, desired data can be written into the corresponding memory cell. When it is desired to erase the data from the two-transistor memory cell, 20 V, 5 V and 0 V are respectively applied to the control gate 15, the select gates 42 and 43, and the drain diffusion layer 44, the source diffusion layer 17 and the silicon semiconductor substrate 11. In doing so, an inversion layer is formed in a channel portion below the floating gate 13 so that the electrons are injected and stored in the floating gate 13. Since a voltage of 20 V is applied to all the control gates 15 coupled to each control line 52, the minimum unit of erase may preferably be set to units of the control lines 52 or more to perform the erasing. It is desirable that the thickness of the tunnel oxide layer 12 may be less than or equal to 100 Å because a write and erase voltage can be reduced. The thickness of the ONO stacked insulating film 14 may preferably range from about 150 Å to 200 Å on an oxide-film conversion basis. The gate length of each stack type transistor may preferably be 0.6 µm or so, for example. As the thickness of the gate oxide film 41 of each select transistor, the same thickness as that of the tunnel oxide 12 can be used. As the gate length of each select transistor, the same gate length as that of each stack type transistor can be used.

Advantages obtained by comparing the present embodiment with the stack type and NAND type memory cells will first be described below. The cell size is slightly increased to the order of 1.5 times the size of the stack type memory cell by providing the single select transistor for each memory cell as described above. However, the present embodiment can bring about advantages or merits on performance and functions, which are not included in the stack type and NAND type memory cells, as is apparent from advantages described in the following. The present merits can offset size demerits depending on the purpose. A first advantage is that the present embodiment is suitable for a low voltage operation. Since the FN current is used for the writing and erasing, a necessary voltage can be easily generated from an on-chip boosting circuit. Further, since a write and erase decision threshold level can be also determined from the threshold value of each select transistor, the present embodiment can be set to a low source voltage of a 3 V or less regardless of a variation in the threshold value due to the writing and erasing.

A second advantage is that rewrite endurance is excellent. Since the allowable range of threshold value is wide as described above, the present embodiment is very hard to fail as compared with the conventional example even if a certain variation in the threshold value takes place when rewriting is repeated. It is thus possible to achieve rewrite endurance corresponding to one million times which are one order of magnitude greater as compared with the conventional example.

Advantages obtained by comparing the present embodiment with the FLOTOX type memory cell will now be described. Since the tunnel oxide is formed over the entire surface of the silicon semiconductor substrate without being formed in the portion of the lower part of each floating gate, it is unnecessary to take the alignment allowance into consideration. It is thus possible to reduce each cell size to about 40%.

Thus, the quality of each tunnel oxide can be greatly improved so that the rewrite endurance can be improved.

In a second embodiment of the present invention, both erase and write operations can be performed on a one-pulse basis without the verify operation. Since the select transistor is turned OFF even if the threshold value is rendered negative owing to the provision of the select transistor, data can be deeply erased from each memory cell without noticing overerasing as in the case of the stack type memory cell. Although each NAND type memory cell is prohibited from being completely turned OFF, each memory cell employed in the present embodiment may be completely turned OFF even if the threshold value is brought to any high value. It is therefore unnecessary to pay any attention to overwriting. Thus, a threshold-value write level may be rendered negative if it is 2 V or less, for example. Further, an erase level may be any high level if it is 2.5 V or more. The verify operation become entirely necessary owing to such a wide allowable threshold level and the write and erase operations can be performed at a high speed. In practice, the writing of data into a memory cell and erasing it therefrom can be completed within a few mseconds or less. If large quantity of data are processed as a single unit, then a data transfer rate can be easily raised.

In a third embodiment of the present invention, a thick film thickness, which is different from that of each tunnel oxide 12, can be used for the gate oxide film 41. Thus, an electric field applied to the gate oxide film upon writing or erasing can be reduced and the reliability of a product can be increased. When a thickness of 200 Å is used as the thickness of each gate oxide film, it is desirable that a write/erase voltage is lowered provided that a thickness of 100 Å or less is used as the thickness of the tunnel oxide 12.

In a fourth embodiment of the present invention, a gate length shorter than that of each select transistor can be used as the gate length of the stack type transistor. So long as the select transistor is set so as to be fully turned OFF, the gate length of the stack type transistor can be shortened so that the cell size can be reduced.

In a fifth embodiment of the present invention, the density of impurities of each drain diffusion layer 44 close to the select gates 42 and 43 of each select transistor can be made thinner than the impurity density of the intermediate diffusion layer 45. Thus, an electric field generated in the vicinity of the drain diffusion layer 44 upon writing can be lightened and the reliability of a product can be raised.

In a sixth embodiment of the present invention, if the common source diffusion-layer interconnect 32 is divided, a voltage of 10 V, for example, is applied to the source diffusion layer 17 as an erase prohibition voltage and the select gates 42 and 43 are turned OFF, data can be erased from only memory cells with no erase prohibition voltage applied thereto without being erased from all the memory cells related to the control lines 52. Thus, the unit of erase can be set to a unit smaller than the units of the control lines 52. Therefore, data can be erased in a byte unit.

As described above, the present invention is most suitable for a portable device that needs a lower voltage operation and a flash memory advantageous for the storing of data therein, which needs a high-speed write operation.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A flash type memory cell comprising:

a first transistor having a floating gate and a control gate stacked on a semiconductor substrate;

a second transistor having gates stacked on one another with a drain diffusion layer of said first transistor as a source diffusion layer of said second transistor, said gates being made of the same materials as those of the floating gate and the control gate; and a memory cell each provided as a single unit, being composed of said first transistor and said second transistor;

said second transistor being electrically connected to one another at a location different from that of said single-unit memory cell and activated as select gates;

wherein the density of impurities of said drain diffusion layer of said second transistor, said impurities being provided in the neighborhood of the gate thereof, is lower than that of impurities of the drain diffusion layer of said first transistor, said impurities being provided in the neighborhood of the gate thereof.

2. A memory array comprising:

a plurality of flash type memory cells each of which comprises:

a first transistor having a floating gate and a control gate stacked on a semiconductor substrate;

a second transistor having gates stacked on one another with a drain diffusion layer of said first transistor as a source diffusion layer of said second transistor, said gates being made of the same materials as those of the floating gate and the control gate; and a memory cell each provided as a single unit, being composed of said first transistor and said second transistor;

said second transistor being electrically connected to one another at a location different from that of said single-unit memory cell and activated as select gates;

a common source diffusion layer;

a plurality of control lines;

a plurality of select word lines; and a plurality of bit lines;

said common source diffusion layer, said control lines, said select word lines and said bit lines being respectively formed by connecting source diffusion layers of said first transistors to one another in a first direction, connecting control gates of said first transistors to one another in the first direction, connecting gates of said second transistors to one another in the first direction and connecting metal interconnects coupled to the drain diffusion layers of said second transistors to one another in a second direction perpendicular to the first direction when a plurality of said memory cells are disposed; and data erasing being performed by applying a positive voltage to the control line and storing electrons in the floating gate using an FN tunneling current supplied from a channel of said first transistor, data writing being performed by applying a negative voltage to the control line, applying a positive voltage to the select word line and applying a positive voltage to the bit line to thereby draw the electrons from the floating gate to the drain diffusion layer of said first transistor using the FN tunneling current, and data write prohibition being performed by setting the potential on the bit line to near a ground potential.

3. The memory array as claimed in claim 2, wherein the data erasing and writing are carried out on a one-operation basis without verifying a threshold value of each memory cell.

* * * * *